(12) United States Patent
Chen et al.

(10) Patent No.: US 9,640,912 B1
(45) Date of Patent: May 2, 2017

(54) BIDIRECTIONAL ACCESS PORTABLE FLASH DRIVE

(71) Applicants: Chang-Yih Chen, New Taipei (TW); Chang-Lung Chen, New Taipei (TW)

(72) Inventors: Chang-Yih Chen, New Taipei (TW); Chang-Lung Chen, New Taipei (TW)

( * ) Notice: Subject to any disclaimer, the term of this patent is extended or adjusted under 35 U.S.C. 154(b) by 0 days.

(21) Appl. No.: 14/934,159

(22) Filed: Nov. 6, 2015

(51) Int. Cl.
*H01R 12/00* (2006.01)
*H01R 13/642* (2006.01)

(52) U.S. Cl.
CPC .................................. *H01R 13/642* (2013.01)

(58) Field of Classification Search
CPC ...... H01R 13/6658; H01R 4/34; H01R 27/00; H01R 13/65802; H01R 13/658; H01R 31/06; H01R 35/04; H01R 23/7073
USPC .... 439/76.1, 217, 218, 607.01, 607.55, 638, 439/640, 660
See application file for complete search history.

(56) References Cited

U.S. PATENT DOCUMENTS

| | | | | |
|---|---|---|---|---|
| 6,999,322 B1* | 2/2006 | Lin | ...................... | H05K 5/0278 361/733 |
| 7,004,794 B2* | 2/2006 | Wang | ............... | G06K 19/07733 439/660 |
| 7,359,208 B2* | 4/2008 | Ni | .......................... | G11B 33/12 174/50.51 |
| 7,470,148 B1* | 12/2008 | Su | ...................... | H01R 13/6658 439/607.01 |
| 7,740,493 B2* | 6/2010 | Ni | ........................ | H01R 13/453 439/131 |
| 8,116,083 B2* | 2/2012 | Ni | ........................ | G06K 19/041 361/737 |
| 8,414,335 B2* | 4/2013 | Yu | .......................... | H01R 24/60 439/660 |
| 8,770,997 B2* | 7/2014 | Yu | .......................... | H01R 35/02 439/164 |
| 9,075,571 B2* | 7/2015 | Bolotin | ................. | G06F 1/1632 |
| 9,231,344 B1* | 1/2016 | Liao | ........................ | H01R 23/02 |
| 9,294,198 B2* | 3/2016 | Pederson | ............... | H04B 10/40 |
| 9,385,414 B2* | 7/2016 | Lee | ........................... | H01Q 1/22 |

* cited by examiner

*Primary Examiner* — Thanh Tam Le
(74) *Attorney, Agent, or Firm* — Leong C. Lei

(57) ABSTRACT

A bidirectional access portable flash drive includes a casing, which defines therein a receiving space that receives a circuit board mounted therein. The circuit board has a surface on which a memory unit is mounted. The casing has an end to which a double-side pluggable micro-USB connector is mounted. The double-side pluggable micro-USB connector includes a frame and a plate mounted at a predetermined location in the frame. The plate has two surfaces each including a plurality of conductor elements mounted thereon. The plate has two ends at which at least one fixing element is mounted. The memory unit enables effective access and storage of data and the double-side pluggable micro-USB connector provides functions of double-side plugging and protection to achieve an effect of convenient transmission, access, and use of data.

4 Claims, 7 Drawing Sheets

BIDIRECTIONAL ACCESS PORTABLE FLASH DRIVE

(A) TECHNICAL FIELD OF THE INVENTION

The present invention relates generally to a bidirectional access portable flash drive, and more particularly to a portable flash drive that comprises a memory unit for storage of data and a double-side pluggable micro-USB connector for plugging in both sides so as to provide an effect of convenient transmission, storage, and use.

(B) DESCRIPTION OF THE PRIOR ART

In the modern technical era, computers, mobile phones, and tablet computers are each involved with a large amount of digital data. For backup, storage, or carrying of the digital data, USB flash drives are a commonly used data storage device for storage and access of digital data.

The USB flash drives often comprise a casing and a memory unit arranged in the casing. The casing has an end to which a USB connector is mounted. The USB connector enables connection with a computer or other electronic device in order to access digital data contained in the computer or other electronic device thereby achieving a desired effect of data storage and access.

However, although the USB flash drives provide the effect of storage and access of data, the USB connector involved has only one connection surface for connectability with a connection part of the computer. When the USB connector is connected with an incorrect connection surface, damages of the connection part of the computer or the connection part of the USB connector may result and lead to malfunctioning.

Further, besides computers, smart mobile phones are also a popular electronic device. Thus, micro-USB based portable flash drives are also available for connection with a connection part of a smart mobile phone for access or transmission of data.

Nevertheless, although the micro-USB based flash drives are effective in access or transmission of digital data of smart mobile phones, the micro-USB based flash drives often have a micro-USB connector that has only one connection surface, making it inconvenient for use by general consumers and having an extremely high potential risk of damage.

Thus, in view of the problem that USB flash drives and micro-USB based flash drives are both imperfect designs, the present invention aims to provide a bidirectional access portable flash drive that allows for double-side plugging, makes use easy and convenient, and reduces the potential risk of damage so as to eliminate the drawbacks of the known devices and to improve the performance thereof.

SUMMARY OF THE INVENTION

In view of the above-discussed drawbacks and shortcomings of the conventional portable flash drives, the present invention comprises a double-side pluggable micro-USB connector that involves am additional, second plate for providing an effect of double-side plugging so as to prevent a connector of a mobile phone, a computer, or other devices from being damage due to incorrect connection with a connection surface and to eliminate the potential risk that subsequent use is not available when the sole micro—the USB connector get impaired.

The present invention provides a bidirectional access portable flash drive, which comprises a casing. The casing comprises a receiving space formed therein, and the receiving space comprises a circuit board mounted therein. The circuit board has a surface on which a memory unit is mounted. The casing has an end to which a double-side pluggable micro-USB connector is mounted. The double-side pluggable micro-USB connector comprises a frame and a plate is mounted at a predetermined location in the frame. The plate has two surfaces each comprising a plurality of conductor elements mounted thereon. The plate has two ends at which at least one fixing element is mounted.

For the above-described plate, the plate is mounted at a middle portion in an interior of the frame.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
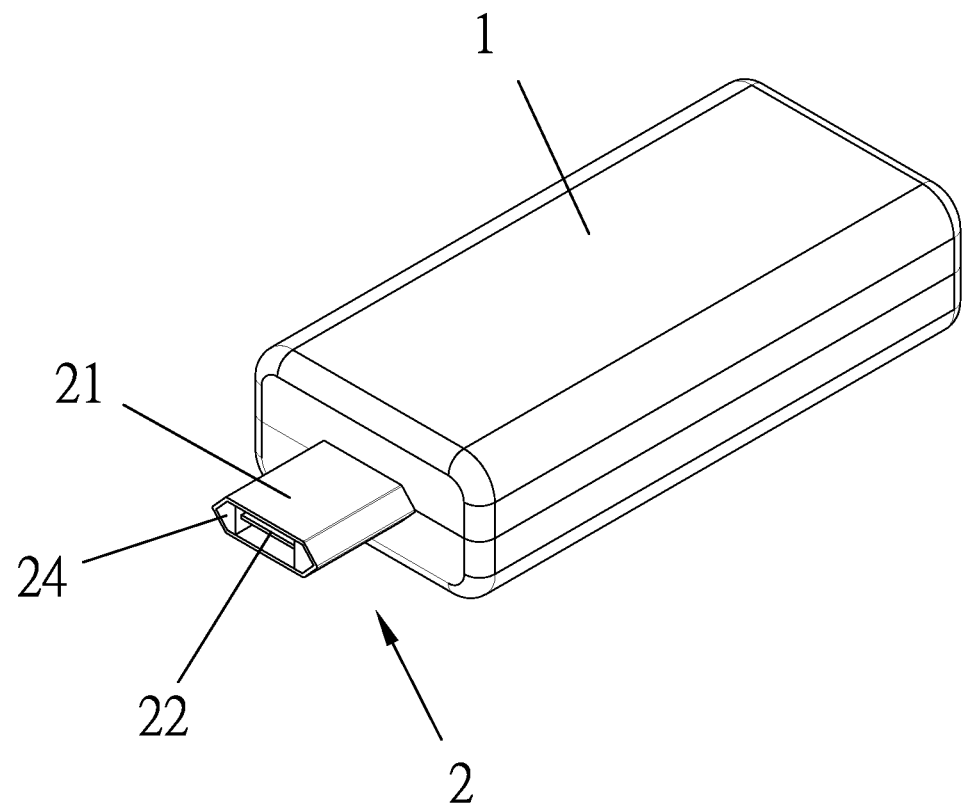
FIG. 1 is a perspective view of the present invention.
Figure 2:
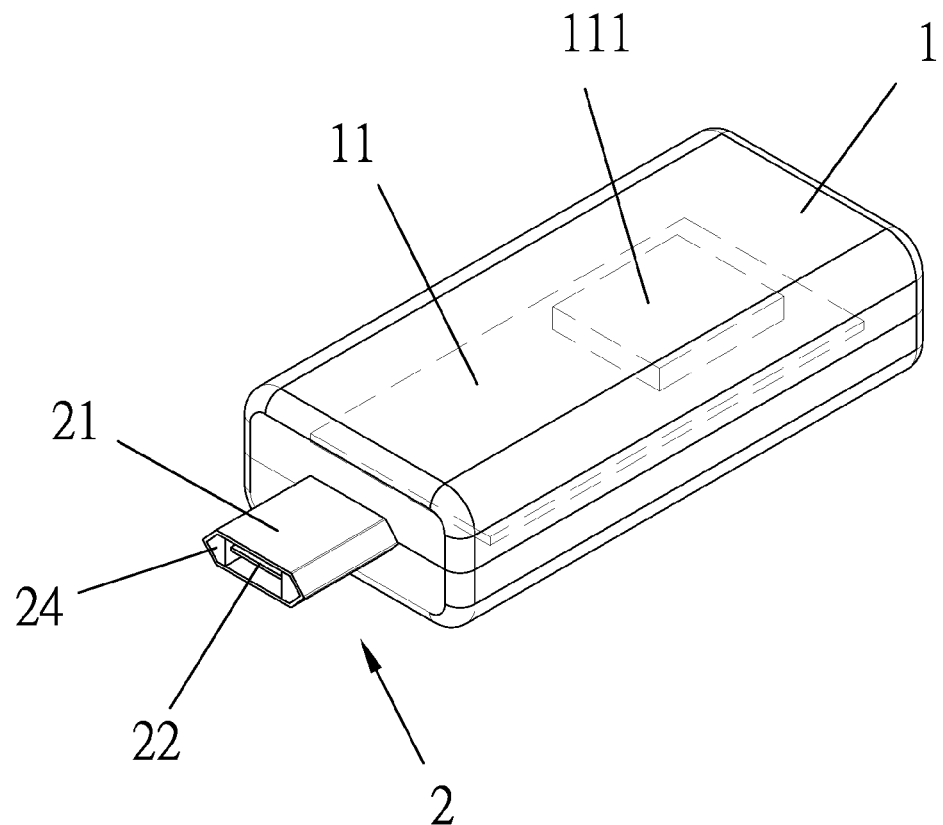
FIG. 2 is another perspective view of the present invention, illustrating certain internal parts.

Referring to FIGS. 1 and 2, which are perspective views illustrating the present invention, as shown in the drawings, the present invention generally comprises a casing 1. The casing 1 comprises a receiving space formed therein, and the receiving space comprises a circuit board 11 mounted therein. The circuit board 11 has a surface or a side on which a memory unit 111 is mounted. The casing 1 has an end to which a double-side pluggable micro-USB (Universal Serial Bus) connector 2 is mounted. The double-side pluggable micro-USB connector 2 comprising a frame 21 and the frame 21 has an interior space in which a plate 22 is mounted at a middle portion thereof. The plate 22 has two surfaces or sides each comprising a plurality of conductor elements 23 mounted thereon. The plate 22 has two ends at which at least one fixing element 24 is mounted.

Figure 3:
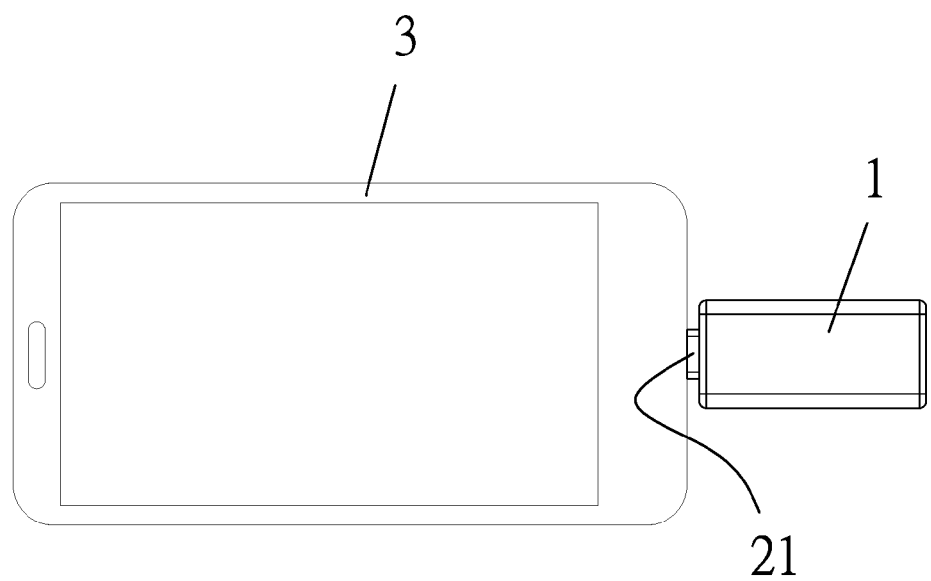
FIG. 3 is a schematic view illustrating the use of the present invention.
Figure 4:
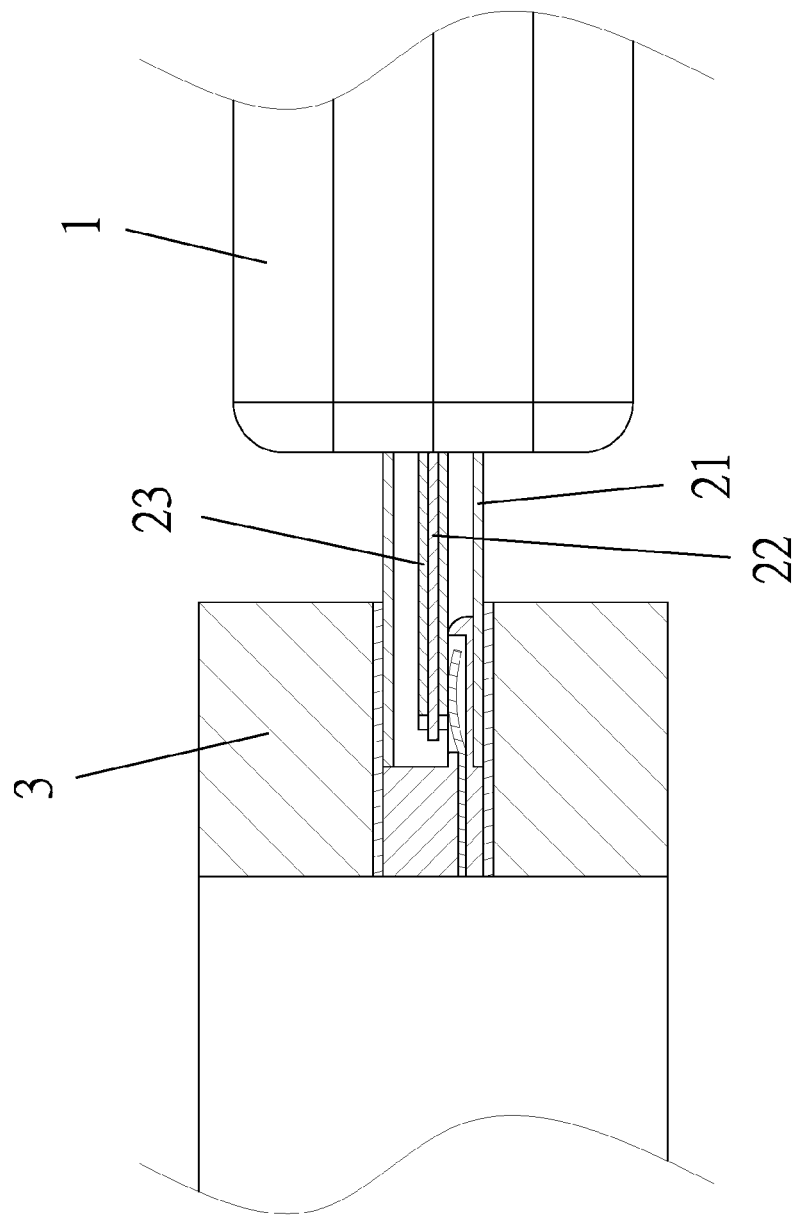
FIG. 4 is a cross-sectional view illustrating the use of a double-side pluggable micro-USB (Universal Serial Bus) connector according to the present invention.

Referring to FIGS. 3 and 4, which are respectively a schematic view illustrating the use of the present invention and a cross-sectional view illustrating the use of the double-side pluggable micro-USB connector according to the present invention, as shown in the drawings, connection to an external device 3 can be made with the double-side pluggable micro-USB connector 2 to allow the memory unit 111 subsequently access data stored in the external device 3 or to process data contained in the memory unit 111 through for example movement, deletion, or modification, so as to provide an effect of access or change the data.

Figure 5:
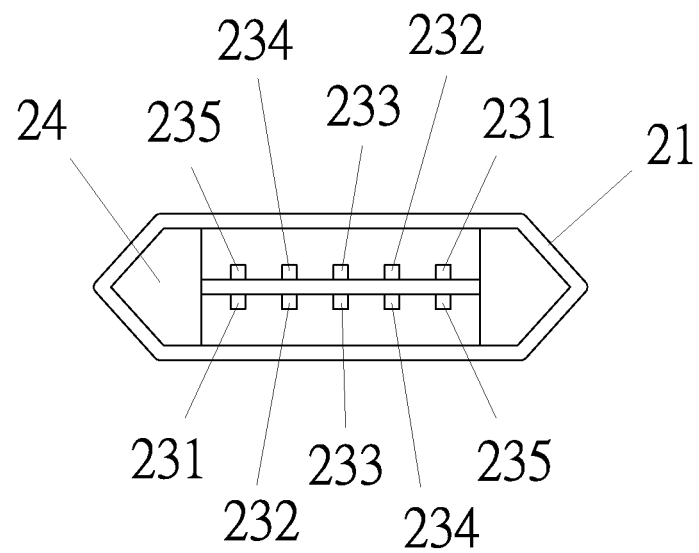
FIG. 5 is a schematic view illustrating the double-side pluggable micro-USB connector according to the present invention.

Referring to FIG. 5, which is a schematic view illustrating the double-side pluggable micro-USB connector according to the present invention, as shown in the drawing, the plate 22 has two surfaces or sides each comprising conductor elements 23 mounted thereon, wherein on one surface or side of the plate 22, the conductor elements 23 include, in sequence from left to right, a power terminal (V) 231, a first data terminal (D1) 232, a second data terminal (D2) 233, an identification terminal (ID) 234, and a grounding terminal (G) 235 and oppositely, on the other surface or side of the plate 22, the conductor elements 23 include, in sequence from right to left, a grounding terminal (G) 235, an identification terminal (D) 234, a second data terminal (D2) 233, a first data terminal (D1) 232, and a power terminal (V) 231. In this way, one surface (for example the upper surface) of the plate 22 is structured to have the conductor elements 23 arranged in an opposite way to the arrangement of the conductor elements 23 of the other surface (for example a lower surface) the plate 22 thereby forming mirror symmetry that enables the double-side pluggability.

Figure 6:
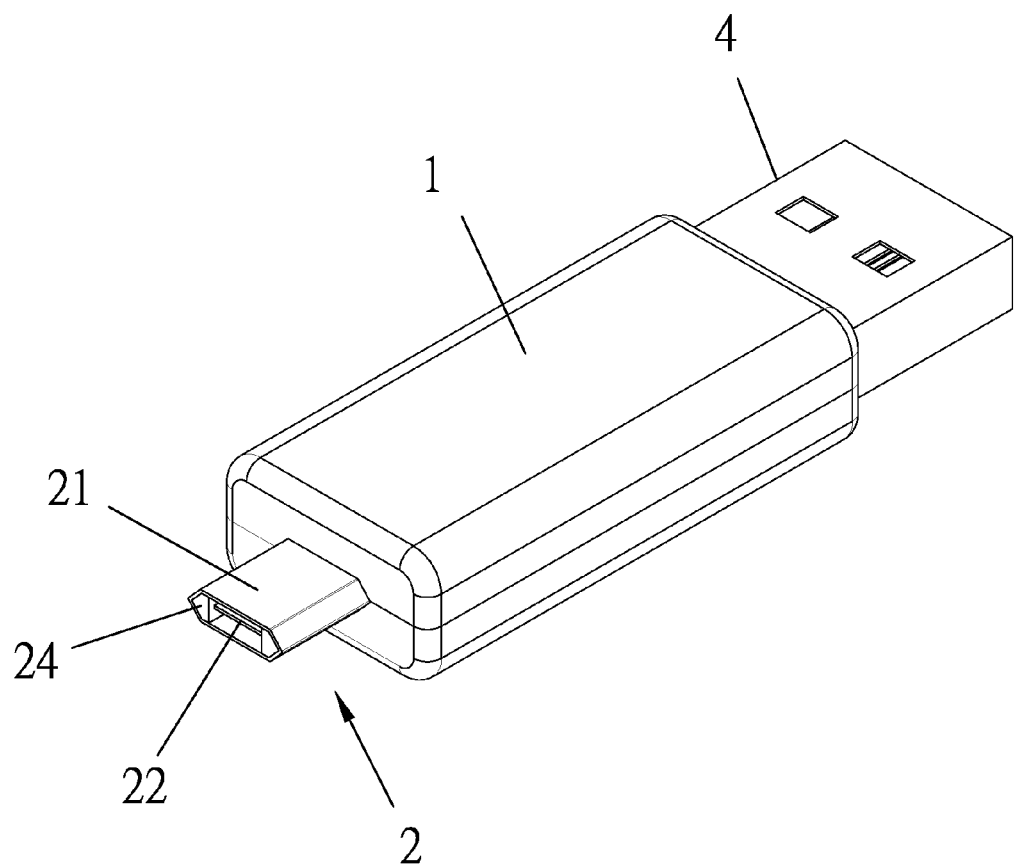
FIG. 6 is a perspective view of an embodiment of the present invention.
Figure 7:
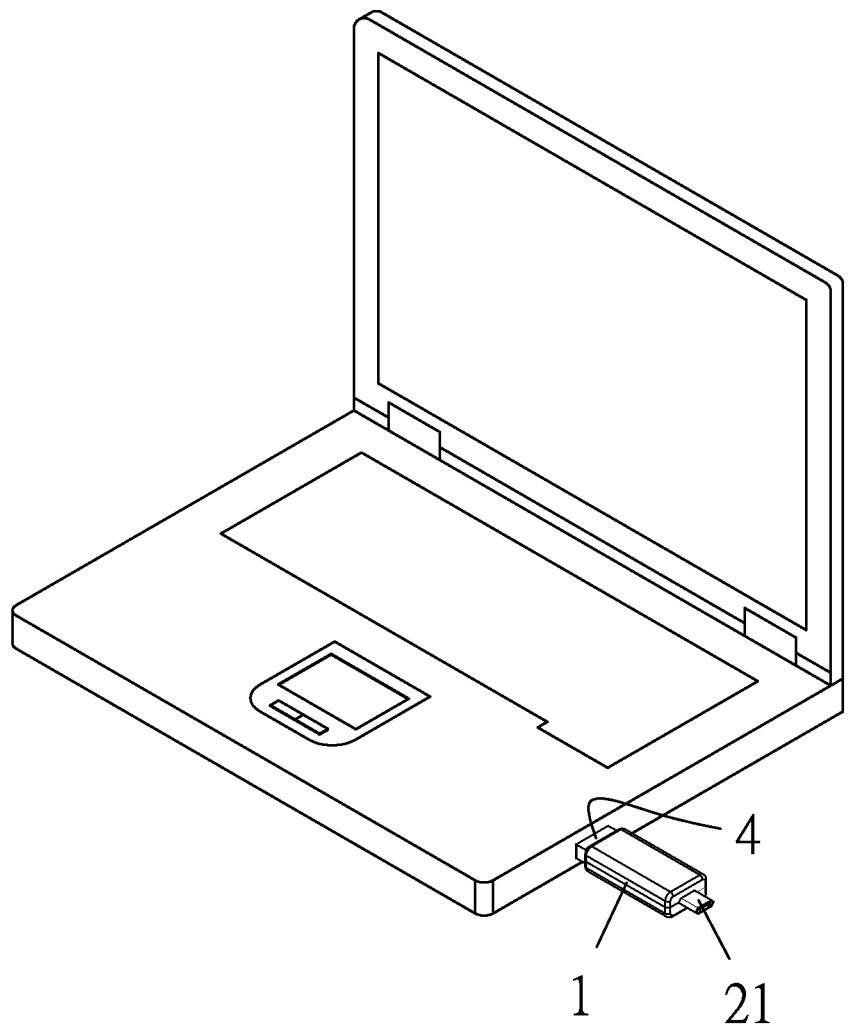
FIG. 7 is a schematic view illustrating the use of the embodiment of the present invention.

Referring to FIGS. 6 and 7, which are respectively a perspective view of an embodiment of the present invention and a schematic view illustrating the use of the embodiment of the present invention, as shown in the drawings, the casing 1 has an opposite end to which a USB connector 4 is mounted so that through the USB connector 4, connection can be made to a USB receptacle or alternatively or additionally, through the double-side pluggable micro-USB connector 2, connection can be made to an external device 3, to provide an effect of connection.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A bidirectional access portable flash drive, comprising:
a casing, defining a receiving space therein, the receiving space receiving a circuit board mounted thereon, the circuit board having a surface on which a memory unit is mounted; and
a double-side pluggable micro-USB connector, mounted to an end of the casing, the double-side pluggable micro-USB connector comprising a frame, a plate being mounted at a predetermined location in an interior of the frame, the plate having two surfaces each comprising a plurality of conductor elements mounted thereon;
wherein the plate further comprises two opposite end surfaces perpendicular with the two surfaces, two fixing elements each being provided in the casing at each of the two opposite end surfaces and being extended beyond a front end of the plate.

2. The bidirectional access portable flash drive according to claim 1, wherein the plate is set at a middle portion of the interior of the frame.

3. A bidirectional access portable flash drive, comprising:
a casing, defining a receiving space therein, the receiving space receiving a circuit board mounted thereon, the circuit board having a surface on which a memory unit is mounted;
a double-side pluggable micro-USB connector, mounted to an end of the casing, the double-side pluggable micro-USB connector comprising a frame, a plate being mounted at a predetermined location in an interior of the frame, the plate having two surfaces each comprising a plurality of conductor elements mounted thereon; and
a USB connector, mounted to an opposite end of the casing;
wherein the plate further comprises two opposite end surfaces perpendicular with the two surfaces, two fixing elements each being provided in the casing at each of the two opposite end surfaces and being extended beyond a front end of the plate.

4. The bidirectional access portable flash drive according to claim 3, wherein the plate is set at a middle portion of the interior of the frame.

* * * * *